United States Patent
Katoh et al.

(10) Patent No.: US 10,084,122 B2
(45) Date of Patent: Sep. 25, 2018

(54) LIGHT-EMITTING APPARATUS AND METHOD OF MANUFACTURING THE SAME

(71) Applicants: CITIZEN ELECTRONICS CO., LTD., Fujiyoshida-shi, Yamanashi (JP); CITIZEN WATCH CO., LTD., Tokyo (JP)

(72) Inventors: Tatsuya Katoh, Ebina (JP); Sadato Imai, Yamanashi (JP)

(73) Assignees: CITIZEN ELECTRONICS CO., LTD., Yamanashi (JP); CITIZEN WATCH CO., LTD., Tokyo (JP)

( * ) Notice: Subject to any disclaimer, the term of this patent is extended or adjusted under 35 U.S.C. 154(b) by 428 days.

(21) Appl. No.: 14/801,308

(22) Filed: Jul. 16, 2015

(65) Prior Publication Data

US 2016/0018078 A1 Jan. 21, 2016

(30) Foreign Application Priority Data

Jul. 17, 2014 (JP) .................................. 2014-147158

(51) Int. Cl.
  *H01L 33/60* (2010.01)
  *H01L 33/46* (2010.01)
  *H01L 25/075* (2006.01)

(52) U.S. Cl.
  CPC .......... *H01L 33/60* (2013.01); *H01L 25/0753* (2013.01); *H01L 33/46* (2013.01); *H01L 2224/48091* (2013.01); *H01L 2224/48137* (2013.01); *H01L 2924/0002* (2013.01)

(58) Field of Classification Search
  CPC ................................ H01L 33/60; H01L 33/46
  See application file for complete search history.

(56) References Cited

U.S. PATENT DOCUMENTS

| | | | |
|---|---|---|---|
| 2007/0102722 A1 | 5/2007 | Ishizaka et al. | |
| 2007/0181900 A1 | 8/2007 | Sato et al. | |
| 2012/0146077 A1* | 6/2012 | Nakatsu | H01L 33/486 257/98 |
| 2012/0153313 A1 | 6/2012 | Yokotani et al. | |
| 2013/0328070 A1 | 12/2013 | Hussell et al. | |
| 2015/0091029 A1 | 4/2015 | Funakubo | |
| 2015/0325761 A1 | 11/2015 | Imai | |

FOREIGN PATENT DOCUMENTS

| | | |
|---|---|---|
| EP | 2023409 A1 | 2/2009 |
| JP | 55-132083 A | 10/1980 |
| JP | 2003121623 A | 4/2003 |
| JP | 2006351808 A | 12/2006 |

(Continued)

*Primary Examiner* — Seahvosh Nikmanesh
(74) *Attorney, Agent, or Firm* — RatnerPrestia

(57) ABSTRACT

A light-emitting apparatus is provided which can improve the reflectance of light in the emission wavelength region of the LED. The light-emitting apparatus includes a mount board constituted by a metal support, a circuit board provided with an opening and fixed onto the mount board, a multi-layered film containing silver as a light-reflecting material, the multi-layered film being stacked on the mount board exposed in the opening, exclusive of a portion of the mount board onto which the circuit board is fixed, and an LED element mounted on the multi-layered film.

6 Claims, 5 Drawing Sheets

(56) References Cited

FOREIGN PATENT DOCUMENTS

| | | | |
|---|---|---|---|
| JP | 2007072190 | A | 3/2007 |
| JP | 2007-129053 | A | 5/2007 |
| JP | 2007-194385 | A | 8/2007 |
| JP | 2009032828 | A | 2/2009 |
| JP | 2009290238 | A | 12/2009 |
| JP | 2010263242 | A | 11/2010 |
| JP | 2011151339 | A | 8/2011 |
| JP | 2012134305 | A | 7/2012 |
| JP | 2013008721 | A | 1/2013 |
| JP | 2014007205 | A | 1/2014 |
| WO | 2013150882 | A1 | 10/2013 |
| WO | 2014083714 | A1 | 6/2014 |

* cited by examiner

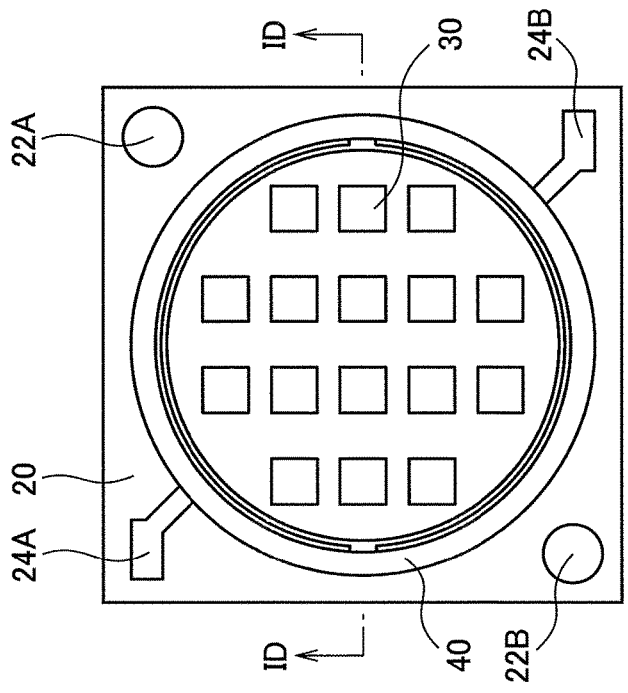
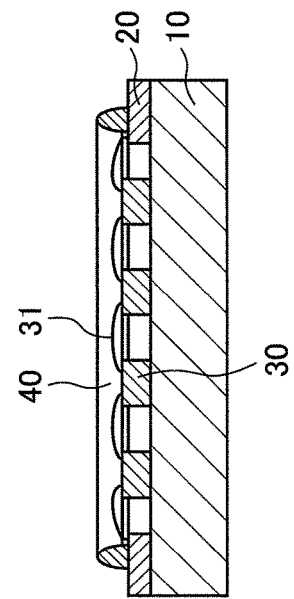
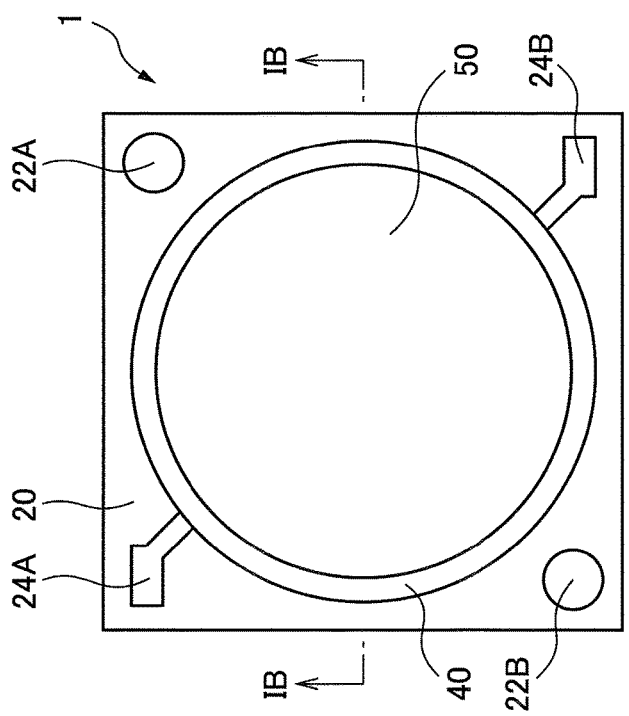
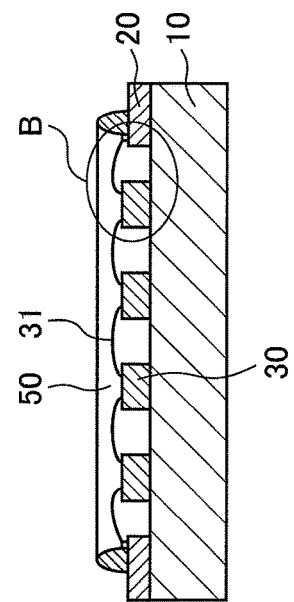

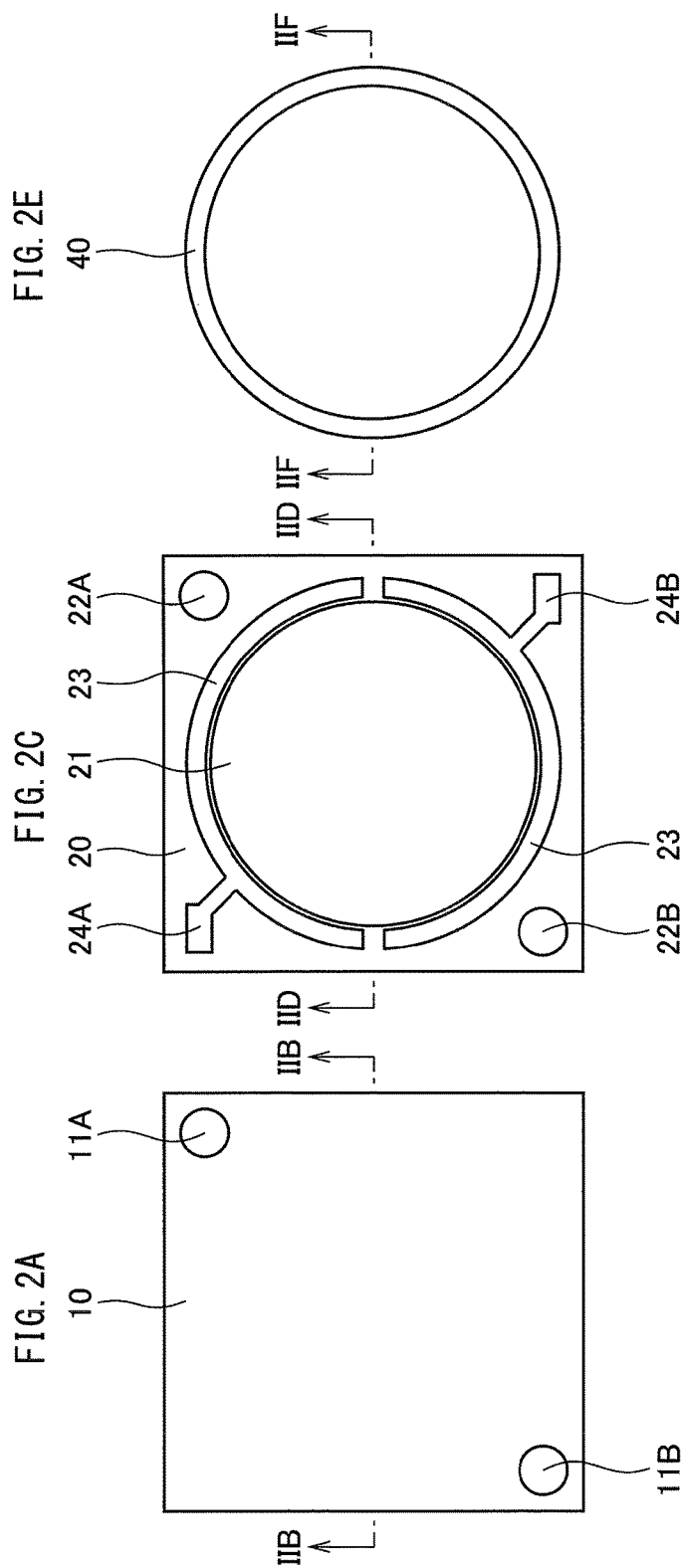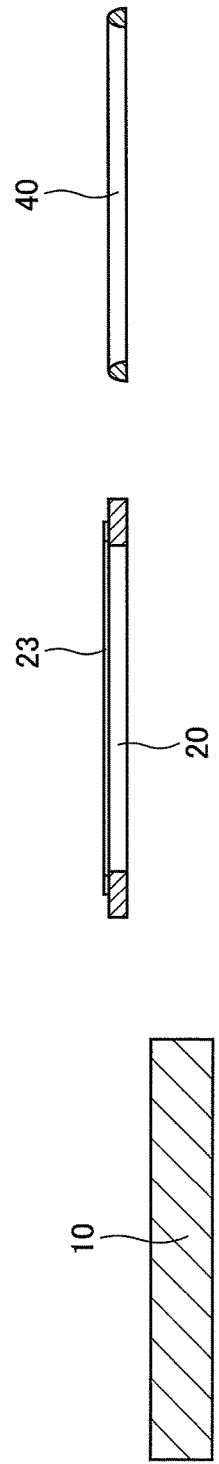

LIGHT-EMITTING APPARATUS AND METHOD OF MANUFACTURING THE SAME

CROSS REFERENCE TO RELATED APPLICATION

This application is a new U.S. patent application that claims benefit of JP 2014-147158, filed on Jul. 17, 2014. The entire contents of JP 2014-147158 are hereby incorporated by reference.

TECHNICAL FIELD

The present invention relates to a light-emitting apparatus and a manufacturing method thereof.

BACKGROUND

In light-emitting apparatuses including LEDs (light-emitting diodes), from the viewpoint of thermal resistance and heat dissipation, boards made of a metal such as aluminum are widely used for mount boards onto which LEDs are mounted. For example, Japanese Unexamined Patent Publication No. S55-132083 describes a light-emitting diode board constituted by an aluminum support, an alumite layer placed thereon, a transparent insulating thin layer on the alumite layer and a layer of printed wiring on the insulating layer, the layer of printed wiring having a light emitting diode attached thereon. Japanese Unexamined Patent Publication No. 2007-129053 describes a light-emitting apparatus including an alumite-treated aluminum plate support, a printed circuit board attached thereon provided with an electrically conductive pattern formed on the board and an opening, and an LED chip mounted on the support inside the opening.

In addition, Japanese Unexamined Patent Publication No. 2007-194385 describes a semiconductor light-emitting apparatus including a silicon substrate, an insulating silicon oxide film formed thereon, a bonding layer made from Ti (titanium) or Cr (chromium) on the insulating film, a barrier metal layer made from Ni (nickel) or Pt (platinum) or Pd (palladium) on the bonding layer, a silver alloy layer made on the barrier metal layer, a semiconductor light-emitting element electrically connected to the silver alloy layer.

SUMMARY

In order to improve luminous efficiency, the mount board of LEDs in a light-emitting apparatus requires light reflectivity as well as thermal resistance and heat dissipation. In view of the above, it is an object of the present invention to improve the reflectance of light in the emission wavelength region of the LED, as compared with the case where the configuration of the invention was not employed.

A light-emitting apparatus includes a mount board constituted by a metal support, a circuit board provided with an opening and fixed onto the mount board, a multi-layered film containing silver as a light-reflecting material, the multi-layered film being stacked on the mount board exposed in the opening, exclusive of a portion of the mount board onto which the circuit board is fixed, and an LED element mounted on the multi-layered film.

Preferably, in the above light-emitting apparatus, the mount board has a light reflectance of more than or equal to 95% in a whole emission wavelength region of the LED element.

Preferably, in the above light-emitting apparatus, the multi-layered film includes a nickel layer, a silver layer, an aluminum oxide layer, a silicon dioxide layer and a titanium oxide layer in the mentioned order from the side closer to the mount board.

Preferably, in the above light-emitting apparatus, the silicon dioxide layer and the titanium oxide layer are alternately stacked multiple times on the side further from the mount board.

Preferably, in the above light-emitting apparatus, the mount board includes, on a support made of aluminum as the metal support, a second multi-layered film including an aluminum oxide layer, an aluminum layer, a silicon dioxide layer and a titanium oxide layer stacked in the mentioned order from the side closer to the support.

A method of manufacturing a light-emitting apparatus includes the steps of (a) fixing onto a mount board constituted by a metal support, a circuit board provided with an opening, (b) stacking a multi-layered film containing silver as a light-reflecting material on the mount board exposed in the opening, exclusive of a portion of the mount board onto which the circuit board is fixed, and (c) mounting an LED element on the multi-layered film.

Preferably, in step (b) of the above method, a layer containing silver as a light-reflecting material is fabricated by vapor deposition.

The above light-emitting apparatus and manufacturing method thereof can improve the reflectance of light in the emission wavelength region of the LED, as compared with the case where the configuration of the invention was not employed.

BRIEF DESCRIPTION OF THE DRAWINGS

Other features and advantages of the present invention will be apparent from the ensuing description, taken in conjunction with the accompanying drawings, in which:

FIG. 1A to FIG. 1D are top and cross-sectional views of a light-emitting apparatus 1;

FIG. 2A to FIG. 2F are top and cross-sectional views of the mount board 10, the circuit board 20, and the reflector frame 40;

DESCRIPTION

Figure 3:
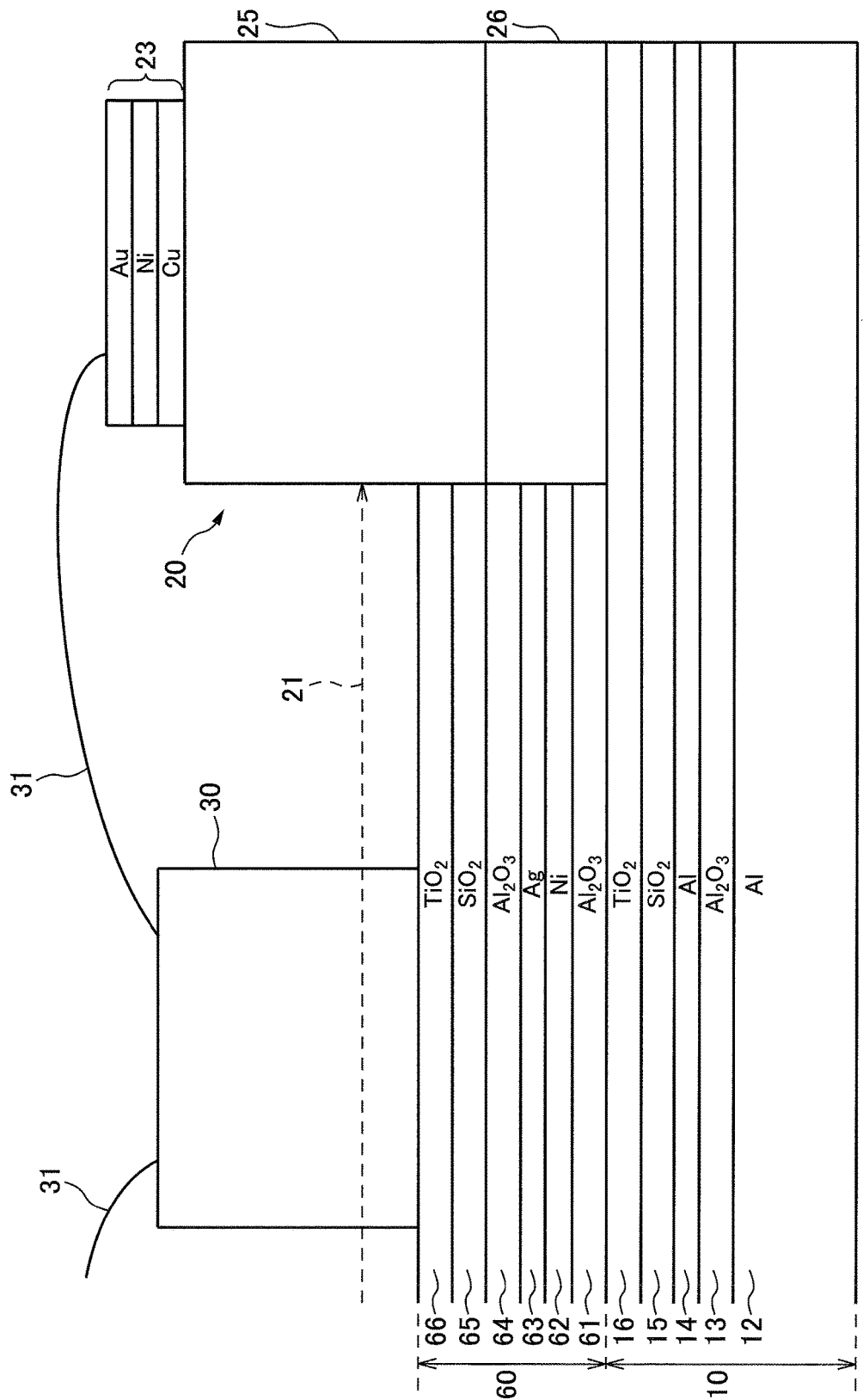
FIG. 3 is an enlarged view of the portion B in FIG. 1B.

Hereinafter, with reference to the drawings, a light-emitting apparatus and a manufacturing method thereof will be described. It should be noted that the technical scope of the present invention is not limited to embodiments of the invention, but covers the invention described in the claims and its equivalent.

FIG. 1A to FIG. 1D are top and cross-sectional views of a light-emitting apparatus 1. The light-emitting apparatus 1 includes a mount board 10, a circuit board 20, LED elements 30, a reflector frame 40 and sealing resin 50 as main components. FIG. 1A and FIG. 1B depict a top view and a cross-sectional view along the line IB-IB of the light-emitting apparatus 1 as a completed product, respectively. FIG. 1C and FIG. 1D depict a top view and a cross-sectional view along the line ID-ID of the light-emitting apparatus 1 after the removal of the sealing resin 50 in order to display the mounting status of the LED elements 30.

FIG. 2A and FIG. 2B are a top view and a cross-sectional view along the line IIB-IIB of the mount board 10. FIG. 2C and FIG. 2D are a top view and a cross-sectional view along the line IID-IID of the circuit board 20. FIG. 2E and FIG. 2F are a top view and cross-sectional view along the line IIF-IIF of the reflector frame 40.

The mount board 10 is a board having a planar region on which the LED elements 30 are mounted, and is constituted by a metal component in order to enhance heat dissipation. The mount board 10 is, for example, a metal board constituted by a support made from aluminum that has excellent thermal resistance and heat dissipation. The mount board 10 has, for one example, a square shape and has fixing through-holes 11A, 11B placed near the two vertices thereof diagonally facing each other.

The circuit board 20 has, for one example, has same size square shape as that of the mount board 10, and has a circular opening 21 formed at the center of the circuit board. The circuit board 20 also has fixing through-holes 22A, 22B placed near the two vertices thereof diagonally facing each other. The circuit board 20 is fixed by bonding the lower surface thereof onto the mount board 10 by using a bonding sheet so that the positions of the fixing through-holes 22A, 22B correspond with those of the fixing through-holes 11A, 11B of the mount board 10. A wiring pattern 23 is formed on the upper surface of the circuit board 20 so as to surround the opening 21. In the wiring pattern 23, connection electrodes 24A, 24B are formed near the two vertices where the fixing through-holes 22A, 22B are not placed. One of the connection electrodes 24A, 24B is an anode and the other a cathode, and they are connected to an external power supply to apply voltage for the light emission of the light-emitting apparatus 1.

The LED elements 30 are mounted on the mount board 10 exposed in the opening 21 of the circuit board 20. As will be described later with reference to FIG. 3, a multi-layered film is stacked on the mount board 10 exposed in the opening 21, and the LED elements 30 are mounted on the multi-layered film. The light-emitting apparatus 1 has a plurality of LED elements 30, and FIG. 1C depicts an example in which sixteen LED elements 30 are mounted. The lower surfaces of the LED elements 30 are fixed by, for example, transparent insulation adhesive onto the upper surface of the mount board 10 (more specifically onto the multi-layered film of the mount board 10). Each LED element 30 has a pair of element electrodes on the upper surface thereof, and as depicted in FIG. 1B and FIG. 1D, the element electrodes of adjacent LED elements 30 are connected to each other by bonding wires 31. The bonding wires 31 from LED elements 30 positioned closest to the outer perimeter of the opening 21 are connected to the wiring pattern 23 of the circuit board 20.

The reflector frame 40 is a circular frame body made from a white resin so as to fit the size of the opening 21, and fixed onto the upper surface of the circuit board 20 at the position overlapping with the wiring pattern 23. The reflector frame 40 reflects light emitted sideward from the LED elements 30 into the upward direction of the light-emitting apparatus 1 (into the direction opposite to the mount board 10 in relation to the LED elements 30).

The sealing resin 50 is a transparent colorless resin such as epoxy or silicon resin and injected into the opening 21 to completely cover and protect the LED elements 30. Fluorescent material is dispersed into the sealing resin 50. When the LED elements 30 are, for example, blue LEDs and green LEDs, a red fluorescent material is dispersed into the sealing resin 50. In this case, the light-emitting apparatus 1 emits white light which is yielded by the mixing of blue light from the blue LEDs, green light from the green LEDs and red light generated by the excitation of the red fluorescent material. In the example depicted in FIG. 1A, the sealing resin 50 is molded into a circular shape and fixed onto the mount board 10, for example, by the reflector frame 40.

FIG. 3 is an enlarged view of the portion B in FIG. 1B. FIG. 3 depicts a portion of the mount board 10 and of the circuit board 20, one of the sixteen LED elements 30 mounted on the mount board 10 and a portion of a multi-layered film 60 formed on the mount board 10. As FIG. 3 schematically depicts the positional relationship of each component, the proportion of the size of each component is not necessarily correct. Further, FIG. 3 omits the depiction of the reflector frame 40 and the sealing resin 50. As for the circuit board 20, a substrate 25 and a bonding sheet 26, and a Cu (copper) layer, a Ni (nickel) layer and an Au (gold) layer which form the wiring pattern 23 are depicted. The LED elements 30 are fixed onto the multi-layered film 60.

As depicted in FIG. 3, the multi-layered film 60 for improving reflection is formed on the mount board 10 exposed in the opening 21 of the circuit board 20. The multi-layered film 60 is formed only on the mount board 10 inside the opening 21, and not formed on the portion onto which the circuit board 20 is fixed. The circuit board 20 has the substrate 25 bonded, without the interposition of the multi-layered film 60, onto the upper surface of the mount board 10 by the bonding sheet 26. In other words, the multi-layered film 60 is stacked, after the bonding of the circuit board 20 onto the mount board 10, on the mount board 10 exposed in the opening 21, exclusive of the portion of the mount board onto which the circuit board 20 is fixed. In this manner, by the exclusion of the multi-layered film 60 between the mount board 10 and the circuit board 20, the adhesion of the circuit board 20 to the mount board 10 is enhanced.

The multi-layered film 60 has an $Al_2O_3$ (aluminum oxide) layer 61, a Ni (nickel) layer 62, an Ag (silver) layer 63, an $Al_2O_3$ layer 64, an $SiO_2$ (silicon dioxide) layer 65 and a $TiO_2$ (titanium oxide) layer 66 in the mentioned order from the side closer to the mount board 10. Each of these layers is formed into a uniform thickness inside the opening 21 by well-known methods such as sputtering, vapor deposition or plating. The thicknesses of the respective layers are, for example, from about 150 to about 600 nm for the $Al_2O_3$ layer 61, from about 75 to about 200 nm for the Ni layer 62, from about 90 to about 200 nm for the Ag layer 63, from about 30 to about 50 nm for the $Al_2O_3$ layer 64, from about 30 to about 50 nm for the $SiO_2$ layer 65, and from about 30 to about 200 nm for the $TiO_2$ layer 66. The multi-layered film 60 has, for example, a thickness of about 1 μm in total.

The $Al_2O_3$ layer 61 is an oxide film layer for insulating the surface of the mount board 10. The $Al_2O_3$ layer 61 is not an indispensable layer, and the Ni layer 62 may be formed directly on the mount board 10.

The Ni layer 62 prevents the corrosion or deterioration of the $Al_2O_3$ layer 61, and functions as a barrier layer for preventing dielectric break-down caused by the diffusion of silver (Ag) into the $Al_2O_3$ layer 61 when Ag which is a light-reflecting material contained in the Ag layer 63 is melted by heat. In place of the Ni layer 62, other metal layers such as palladium (Pd) may be used.

The Ag layer 63 is a layer containing silver (Ag) as a light-reflecting material, and functions as a layer reflecting, into the upward direction of the light-emitting apparatus 1, light emitted from the LED elements 30 to the mount board 10. As a light-reflecting material, other metals with high light reflectance such as aluminum may be used, and Ag is preferably used which has the highest thermal conductivity and light reflectance among all metals.

The $Al_2O_3$ layer 64 is an intermediate layer for bonding the Ag layer 63 to the $SiO_2$ layer 65.

The $SiO_2$ layer 65 and the $TiO_2$ layer 66 function as protection films for preventing the oxidation of Ag contained in the Ag layer 63. Since the $SiO_2$ layer 65 and the $TiO_2$ layer 66 have refractive indices different from one another, they also function as reflecting layers for reflecting, by the difference between the refractive indices, light emitted from the LED elements 30 to the mount board 10. Although reflectance is not very high with only the $SiO_2$ layer 65 and the $TiO_2$ layer 66, placing these two layers in addition to the Ag layer 63 enables the almost 100% reflection of the light emitted from the LED elements 30 to the mount board 10.

For the multi-layered film 60, the $SiO_2$ layer 65 and the $TiO_2$ layer 66 may be alternately stacked multiple times on the upper side (film side further from the mount board 10). The increase in the number of times enables the enhancement of reflectance by the multi-layered film 60, although the enhancement is within a few percent.

As can be seen in FIG. 3, in the light-emitting apparatus 1, the mount board 10 has a multi-layered structure in itself. This is because the smoothness of the mount board 10 on which the multi-layered film 60 is stacked is preferably increased (the surface roughness is preferably decreased) in order to obtain an extremely high reflectance of about 100% by the multi-layered film 60. The mount board 10 has an Al (aluminum) support 12 as a metal support and a multi-layered structure (second multi-layered film) composed of an $Al_2O_3$ layer 13, an aluminum layer 14, an $SiO_2$ layer 15 and a $TiO_2$ layer 16 which are stacked on the Al support 12 in the mentioned order from the side closer to the Al support 12. Since this multi-layered structure improves the smoothness and surface condition of the upper surface of the mount board 10, not only enhancing the adhesion to the circuit board 20 by the bonding sheet 26, but also enabling the subsequent stable film deposition of the multi-layered film 60 under a good condition, and resulting in the further improvement of light reflectance by the multi-layered film 60.

Figure 4:
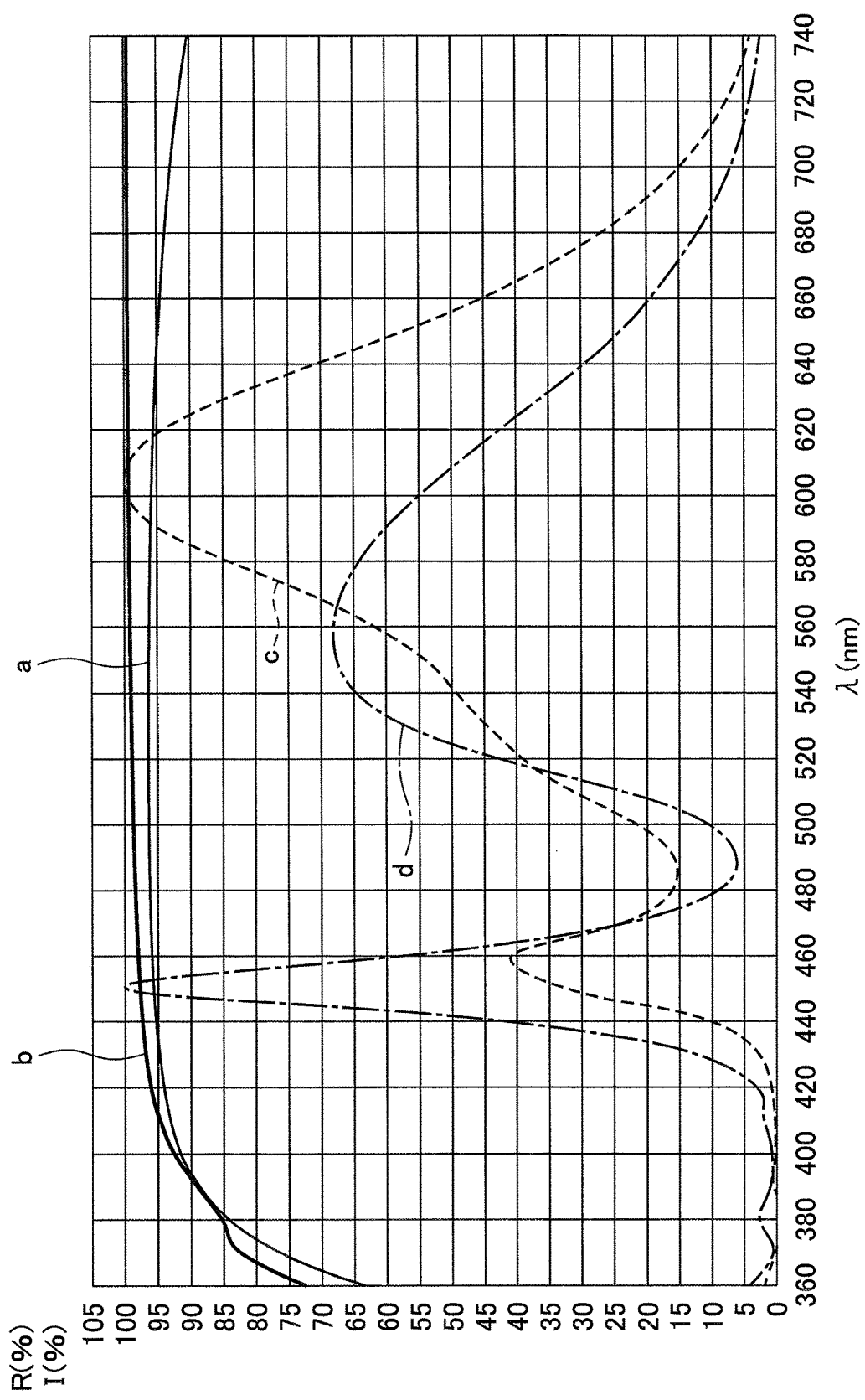
FIG. 4 is a graph displaying the reflectance spectra and light emission spectra of the light-emitting apparatus 1.

FIG. 4 is a graph displaying the reflectance spectra and light emission spectra of the light-emitting apparatus 1. The curve a displays the reflectance spectrum of the mount board 10 without the multi-layered film 60, and the curve b displays the reflectance spectrum of the mount board 10 with the multi-layered film 60 (light-emitting apparatus 1). Further, the curves c and d display the light emission spectra of LED packages (light-emitting apparatus 1) at color temperatures of 2700K, 5000K, respectively. The horizontal axis of the graph indicates wavelength λ (nm), and the vertical axis indicates reflectance R (%) or relative luminescence intensity I (%).

As displayed in FIG. 4 by the curve a, the mount board 10, without the multi-layered film 60, has a reflectance roughly from 90 to 95% in a wavelength region from 420 to 740 nm. On the other hand, as displayed by the curve b, the mount board 10 (light-emitting apparatus 1), with the multi-layered film 60, has a reflectance roughly from 95 to 100% in the same wavelength region. In this manner, it has been confirmed that the reflectance of the light-emitting apparatus 1 is improved by placing the multi-layered film 60.

On the other hand, in wavelength regions of less than or equal to 400 nm, both of the curves a, b display rapid decrease in reflectance with decrease in wavelength. However, as displayed by the curves c, d, the emission wavelength region of the LED is from about 420 to about 740 nm, and within this range, the reflectance of the light-emitting apparatus 1 is maintained to be roughly more than or equal to 95%. In other words, wavelength regions in which the reflectance decreases to less than or equal to 95% are on the wavelength side shorter than the emission wavelength region of the LED. Accordingly, for the light-emitting apparatus 1, placing the multi-layered film 60 enables the increase in the reflectance of light in the emission wavelength region of the LED.

As described above, each layer in the multi-layered film 60 is fabricated by a method such as sputtering, vapor deposition or plating. All layers of the multi-layered film may be fabricated by the same film deposition technique or by the combination of a plurality of film deposition techniques at the same time. However, among others, the Ag layer 63 is preferably fabricated by vapor deposition rather than sputtering because of the improvement of reflectance.

Figure 5:
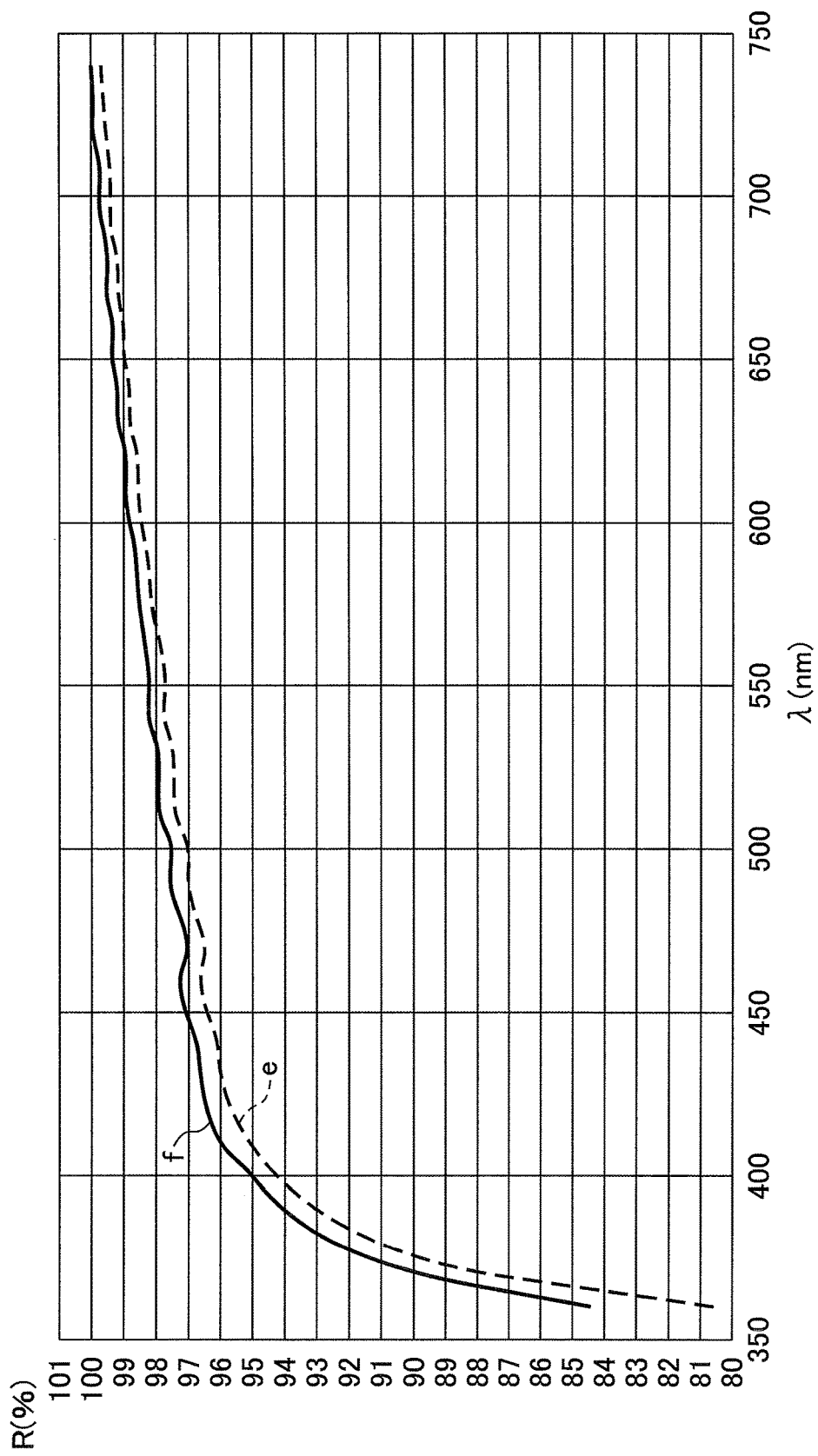
FIG. 5 is a graph displaying the difference of the reflection property of the multi-layered film 60 among film deposition techniques.

FIG. 5 is a graph displaying the difference of the reflection property of the multi-layered film 60 among film deposition techniques. The curve e displays the reflectance spectrum of the mount board 10 with the multi-layered film 60 formed by sputtering, and the curve f displays the reflectance spectrum of the mount board 10 with the multi-layered film 60 formed by vapor deposition. The horizontal axis of the graph indicates wavelength λ (nm), and the vertical axis indicates reflectance R (%).

As can be seen in FIG. 5, in the emission wavelength region (from about 420 to about 740 nm) of the LED, the reflectance of the mount board 10 is from about 0.5 to about 1% higher for the Ag layer fabricated by sputter than by vapor deposition. The reason is probably that in sputtering, impurities contained in a target of raw material for the Ag layer are scattered and deposited with Ag atoms, and in vapor deposition, impurities contained in raw material are not scattered and deposited. In vapor deposition, the improvement of the reflectance is attributed to the Ag layer with high purity which is obtained thanks to the film deposition performed under high vacuum.

As described above, in the light-emitting apparatus 1, the multi-layered film 60 having the Ag layer 63, the $SiO_2$ layer 65 and the $TiO_2$ layer 66 enables the efficient reflection of the light from the LED elements 30 and the improvement of luminous efficiency of the light-emitting apparatus 1 (i.e., brightness as an LED package). The light-emitting apparatus 1 enables, due to the uniform thickness of each layer in the multi-layered film 60, the uniform reflection of the light emitted from the LED elements 30 and the uniform diffusion, toward the mount board 10, of heat associated with the light emission.

Furthermore, for the light-emitting apparatus 1, even if the Ag layer 63 is melted, for example, by heat, placing the Ni layer 62 between the $Al_2O_3$ layer 61 and the Ag layer 63 can avoid the direct influence on the mount board 10. For this reason, the light-emitting apparatus 1 can keep the properties of the mount board 10 and the LED elements 30 stable for a long period of time without deterioration.

The preceding description has been presented only to illustrate and describe exemplary embodiments of the present invention. It is not intended to be exhaustive or to limit the invention to any precise form disclosed. It will be understood by those skilled in the art that various changes may be made and equivalents may be substituted for elements thereof without departing from the scope of the invention. In addition, many modifications may be made to adapt a particular situation or material to the teachings of the invention without departing from the essential scope. Therefore, it is intended that the invention not be limited to the particular embodiment disclosed as the best mode contemplated for carrying out this invention, but that the invention will include all embodiments falling within the scope of the claims. The invention may be practiced otherwise than is specifically explained and illustrated without departing from its spirit or scope.

What is claimed is:

1. A light-emitting apparatus comprising:
   a mount board constituted by a metal support;
   a circuit board provided with an opening and fixed onto the mount board;
   a multi-layered film containing silver as a light-reflecting material, the multi-layered film being stacked on the mount board exposed in the opening, exclusive of a portion of the mount board onto which the circuit board is fixed; and
   an LED element mounted on the multi-layered film,
   wherein the mount board has a light reflectance of more than or equal to 95% in a whole emission wavelength region of the LED element.

2. A light-emitting apparatus comprising:
   a mount board constituted by a metal support;
   a circuit board provided with an opening and fixed onto the mount board;
   a multi-layered film containing silver as a light-reflecting material, the multi-layered film being stacked on the mount board exposed in the opening, exclusive of a portion of the mount board onto which the circuit board is fixed; and
   an LED element mounted on the multi-layered film,
   wherein the multi-layered film comprises a nickel layer, a silver layer, an aluminum oxide layer, a silicon dioxide layer and a titanium oxide layer in the mentioned order from the side closer to the mount board.

3. The light-emitting apparatus according to claim 2, wherein the silicon dioxide layer and the titanium oxide layer are alternately stacked multiple times on the side further from the mount board.

4. A light-emitting apparatus comprising:
   a mount board constituted by a metal support;
   a circuit board provided with an opening and fixed onto the mount board;
   a multi-layered film containing silver as a light-reflecting material, the multi-layered film being stacked on the mount board exposed in the opening, exclusive of a portion of the mount board onto which the circuit board is fixed; and
   an LED element mounted on the multi-layered film,
   wherein the mount board comprises, on a support made of aluminum as the metal support, a second multi-layered film comprising an aluminum oxide layer, an aluminum layer, a silicon dioxide layer and a titanium oxide layer stacked in the mentioned order from the side closer to the support.

5. A method of manufacturing a light-emitting apparatus, comprising the steps of:
   (a) fixing onto a mount board constituted by a metal support, a circuit board provided with an opening;
   (b) stacking a multi-layered film containing silver as a light-reflecting material on the mount board exposed in the opening, exclusive of a portion of the mount board onto which the circuit board is fixed; and
   (c) mounting an LED element on the multi-layered film, wherein the multi-layered film comprises a nickel layer, a silver layer, an aluminum oxide layer, a silicon dioxide layer and a titanium oxide layer in the mentioned order from the side closer to the mount board.

6. The method according to claim 5, wherein a layer containing silver as a light-reflecting material is fabricated by vapor deposition in step (b).

* * * * *